United States Patent [19]
Collins et al.

[11] 4,166,782
[45] Sep. 4, 1979

[54] METHOD OF ANODICALLY LEVELING SEMICONDUCTOR LAYERS

[75] Inventors: David A. Collins; Derek L. Lile, both of San Diego, Calif.

[73] Assignee: The United States of America as represented by the Secretary of the Navy, Washington, D.C.

[21] Appl. No.: 958,459

[22] Filed: Nov. 6, 1978

[51] Int. Cl.² .............................. C25F 3/12; C25F 3/14
[52] U.S. Cl. .................................................. 204/129.3
[58] Field of Search .......................... 204/129.65, 129.3

[56] References Cited

U.S. PATENT DOCUMENTS

| | | | |
|---|---|---|---|
| 3,161,576 | 12/1964 | Teichner | 204/129.65 |
| 3,890,215 | 6/1975 | Di Lorenzo et al. | 204/129.3 |
| 3,962,052 | 6/1976 | Abbas et al. | 204/129.65 |

Primary Examiner—T. M. Tufariello
Attorney, Agent, or Firm—R. S. Sciascia; G. J. Rubens; T. M. Phillips

[57] ABSTRACT

A method for the thinning and automatic leveling of layers of a semiconductor for use in device fabrication applications. The method is to be employed with anodic thinning wherein a conducting semiconductor layer on a high resistivity substrate is placed in a suitable electrolyte and voltage is applied so that the sample is made positive with respect to a cathode, also immersed in the electrolyte. The instant method is directed to the anodic thinning of irregularities in the semiconductor by slowly immersing the semiconductor into the electrolyte such that the location of irregularities can be determined and processed by monitoring the anodic process.

5 Claims, 3 Drawing Figures

: 1

METHOD OF ANODICALLY LEVELING SEMICONDUCTOR LAYERS

BACKGROUND OF THE INVENTION

Many solid-state devices require for their implementation the availability of thin layers of semiconductor of closely controlled thickness. A widely used method of obtaining such layers is that of epitaxial growth whereby single crystal material is deposited from either the liquid phase or vapor phase onto a suitable substrate. Examples of such devices are transferred electron diodes and Schottky gate Field Effect Transistors (FET) fabricated on epitaxial layers of GaAs. There exists a problem of thickness control during growth as well as that of maintaining a uniform thickness over the entire slice, which is essential if high device yields and uniformity of response are obtained. This problem is illustrated by considering the case of the FET which requires for optimum performance doping $n \sim 10^{17}$ cm$^{-3}$ and layers only $\sim 0.2$ $\mu$m in thickness.

An alternative to growing epitaxial layers of the required thickness is to grow an overly thick layer which is subsequently thinned. However, such techniques at best usually remove material uniformly so that initial nonuniformities in thickness are amplified when considered as a percentage of the final layer thickness. In addition, ambiguities resulting from difficulties in measuring thin layer thicknesses always exist.

Anodic thinning is one technique of thinning epitaxial material. Specifically it provides for automatic thinning to a thickness which is required for Schottky gate FET applications despite variations in layer thickness and substrate topography.

Devices prepared by this technique are not uniform over the entire surface but instead have hillocks or isolated regions of greater thickness dispersed randomly over the sample.

SUMMARY OF THE INVENTION

The present invention provides for the anodic thinning of the irregularities on the semiconductor surface by slowly immersing the semiconductor into an electrolyte such that a current path is maintained through the thicker region of the irregular surface of the semiconductor until the thicker region is anodized. The oxide is removed from the surface by washing in dilute HF and the sample dried and the process is repeated until all thicker regions are removed and the surface is uniform in thickness.

Accordingly, an object of the invention is to provide a thin layer semiconductor of closely controlled thickness which will have uniform and smooth surfaces as compared to devices thinned by the anodic thinning process.

Other objects and many of the attendant advantages of this invention will be readily appreciated as the same becomes better understood by reference to the following detailed description when considered in connection with the accompanying drawings.

DESCRIPTION OF THE PREFERRED EMBODIMENT

Figures 1, 2:
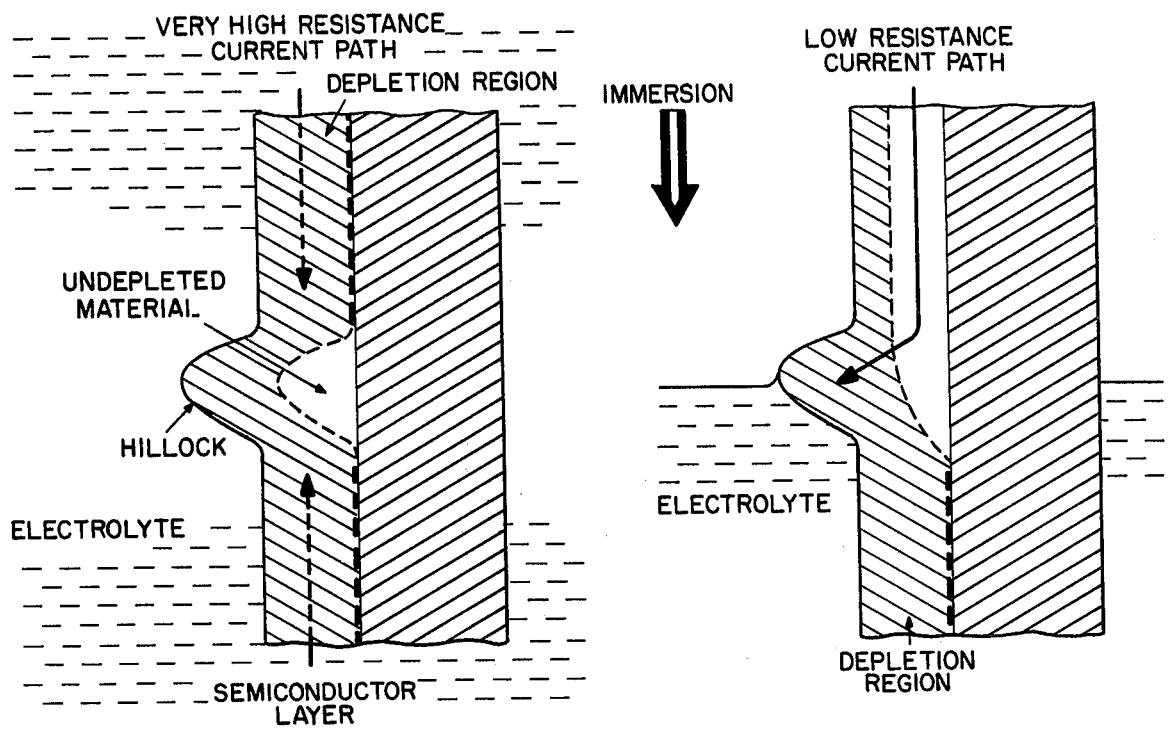
FIG. 1 shows in a simplified drawing the uneven surface of a sample.
FIG. 2 illustrates the interface between the electrolyte and uneven portion of the sample.

In order to understand the invention, the following description of anodic thinning is provided.

A conducting semiconductor layer on a high resistivity substrate is placed in a suitable electrolyte and a voltage is applied such that the sample is made positive with respect to a cathode which is also immersed in the solution. A current will flow between the cathode and the semiconductor. This current will be carried by ionic transport in the electrolyte and by electrons or holes in the semiconductor. At the interface between these two distinct regions of charge transport, i.e., at the semiconductor electrolyte interface, an electrochemical reaction will occur such that electrons will either be liberated from the electrolyte and be injected into the conduction band of the semiconductor or holes from the semiconductor will be released into the electrolyte. The reaction products resulting from this charge exchange will be oxides of the semiconductor elements and will accumulate on the anode or semiconductor surface to form a dielectric layer. The resulting potential drop across this layer will increase with increasing oxide thickness until insufficient potential remains to drive the oxidation reaction. When this occurs the oxidation will terminate.

Following anodization the oxide layer may be readily removed by a number of techniques (e.g., etching in dilute HF) and the anodization repeated. In this way a sample of semiconductor may be progressively reduced in thickness by repeated anodization with subsequent removal of the oxide; each cycle of anodizing and stripping removing a uniform thickness of material from the surface. The advantage of this method of thinning results from the fact that although both electron exchange from the electrolyte to the semiconductor and hole transport in the opposite direction are possible charge exchange mechanisms for the anodic reaction. It is only the latter which contributes to any great extent in the anodic reaction of the larger gap semiconductors. Thus for anodization to proceed, a ready supply of holes in the surface of the semiconductor is necessary. For an n-type semiconductor biased positively, as is the case during anodization, a depletion region will exist at its surface. Holes for the anodic reaction will therefore be supplied either by thermal generation in the space charge layer or by diffusional transport to the space charge region from the bulk. During the repeated anodization and oxide stripping of a uniformly thick n-type epitaxial layer on an insulating substrate, a point will be reached at which the space charge region will reach through to the insulating substrate. At this point the dominant source of hole supply from the bulk through the space charge region to the surface will be cut off and anodization will cease. An alternative way of saying this is the entire epitaxial layer will be essentially depleted of carriers and will be of such a high resistance compared to the rest of the circuit that all the applied voltage drop will be across the epitaxial layer rather than being available to drive the anodic reaction at the surface.

Where the layer is initially of varying thickness, then the anodization will cease initially in those regions where the space charge depletion region first reaches through to the substrate. Such regions will be either where the net doping level is lowest (the extent of the space charge region for a given applied voltage varies as the inverse square root of the doping) or where the film was originally thinnest. In either case the layer will selectively cease to anodize and hence thin further in certain regions of such a nonuniform sample. Further anodization will cause these regions to spread as adjacent regions of film are thinned to the point where the space charge extends completely through the layer. This will continue with repeated cycles of anodization and oxide stripping until the entire sample ceases to anodize.

When the sample initially has such a thickness profile that, as it is thinned by the repeated removal of equal thickness layers of material, islands of thicker material become "isolated" by becoming entirely surrounded by "fully-thinned" material then no current can reach these high spots and no further leveling will occur. FIG. 1 illustrates this situation for the simplest type of layer topography which could produce this situation, namely one isolated hillock in the center of an otherwise uniform layer. Innumerable other examples of thickness profiles could, however, be envisaged which would result in this effect.

Figure 3:
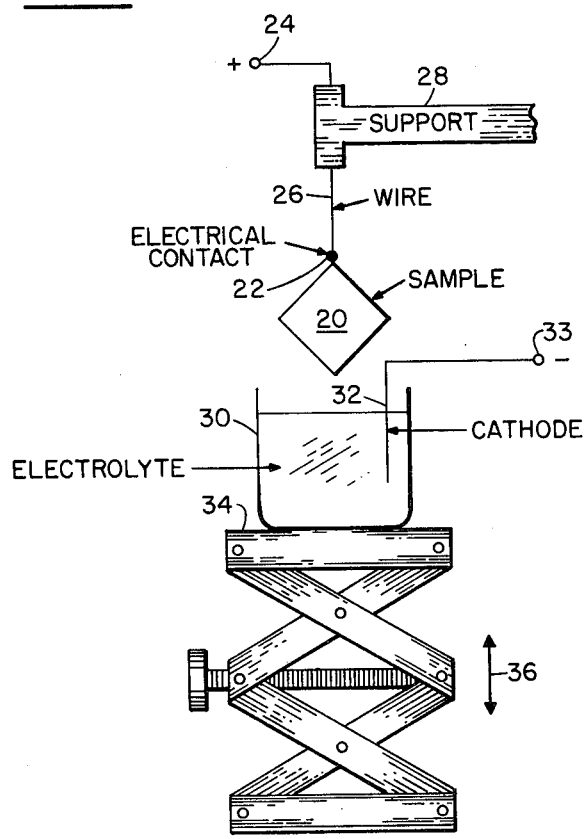
FIG. 3 shows an arrangement of apparatus for practicing the invention.

Any suitable apparatus may be used in practicing the process, such as the apparatus shown in FIG. 3. A sample of GaAs 20 epitaxially deposited on a semi-insulating substrate is connected to a positive voltage source at terminal 24 through electrical contact 22, and wire conductor 26. As shown, the sample 20 is held in a fixed position by means of an insulated support 28. A container 30 is filled with a suitable electrolyte which may be one part 3% aqueous solution of tartaric acid mixed with two to four parts of propylene glycol. Cathode 32 which may be made of platinum is connected to the negative terminal 33 of the voltage source. A voltage source of approximately 120 V was found to be satisfactory.

Container 30 is positioned on a vertically movable platform 34 and may be moved in small increments in either direction as indicated by arrow 36.

The voltage for anodization is applied to the sample and then the sample is slowly immersed into the electrolyte. For the application of this process to an approximately 1 cm$^2$ sample of GaAs, the sample 20 is immersed at a rate which would require approximately 15 minutes to immerse the entire sample. If the current flowing through the sample is monitored it can be observed that "spikes" of current flow during this slow immersion. On removing the sample it can be observed that small regions of oxide have formed at isolated points over the surface of the sample. If this oxide is removed and the sample is again dried and the process repeated, the same isolated oxide pattern will be again observed. Further repetition (not more than 12 times was found to be satisfactory) will finally result in the situation where no further oxidation will occur even by this technique. At this point it is found that the hillocks which initially existed on the sample are now removed. The explanation for the above is believed to be as follows: when totally immersed during anodization such a sample with an isolated hillock will be fully depleted around the hillock and hence no current will be able to reach it to cause further anodization. If the sample is lowered into the electrolyte, the region below the surface of the liquid will be depleted whereas that out of the liquid will not have a surface field applied to it and will only have a relatively small (perhaps zero) depletion region. As the hillock reaches the surface of the electrolyte, the situation will be as shown in FIG. 2 with current now being able to reach the hillock through the undepleted portion of film not yet immersed in the solution. It will thus anodize as it passes through the surface of the electrolyte and will register on a monitoring ammeter as a pulse of current. The rate at which the sample is immersed should be such as to provide sufficient time for the hillock to anodize in the region immediately adjacent to the liquid surface. Similarly, it is important that the sample be dry prior to immersion to prevent wetting the entire sample.

Obviously many modifications and variations of the present invention are possible in the light of the above teachings. It is therefore to be understood that within the scope of the appended claims the invention may be practiced otherwise than as specifically described.

What is claimed is:

1. A process for anodically removing only irregularities on the surface of a previously thinned semiconductor device comprising the steps of:
   applying a positive voltage to the semiconductor device;
   gradually immersing said semiconductor device into a thinning electrolyte to provide sufficient time for only the raised regions on the irregular surface to anodize in the region immediately adjacent to the electrolyte surface as the device is being immersed;
   removing said device from said electrolyte;
   removing the oxide formed on the raised region of said device;
   drying said device;
   repeating said previous steps until oxide no longer forms on said semiconductor device.

2. The process as recited in claim 1 further comprising the step of monitoring the electric current flow such that location of irregularities in the surface of said semiconductor can be determined.

3. The process as recited in claim 1 wherein the rate at which said semiconductor device is immersed is such that a current path is maintained through the thicker region of the irregular surface of the semiconductor until the thicker region is anodized.

4. The process as recited in claim 1 wherein said oxide removing step includes washing the semiconductor in dilute HF.

5. The process as recited in claim 1 wherein said steps are repeated until all thicker regions are removed and the surface of said semiconductor device is uniform in thickness.

* * * * *